United States Patent
Liu et al.

(10) Patent No.: US 10,446,633 B2
(45) Date of Patent: Oct. 15, 2019

(54) TRANSPARENT OLED DISPLAY WITH TRANSPARENT STORAGE CAPACITOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhaosong Liu, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/742,746

(22) PCT Filed: Nov. 29, 2017

(86) PCT No.: PCT/CN2017/113672
§ 371 (c)(1),
(2) Date: Jan. 8, 2018

(87) PCT Pub. No.: WO2019/080255
PCT Pub. Date: May 2, 2019

(65) Prior Publication Data
US 2019/0123121 A1   Apr. 25, 2019

(30) Foreign Application Priority Data
Oct. 24, 2017   (CN) .......................... 2017 1 1003246

(51) Int. Cl.
*H01L 27/32* (2006.01)
*H01L 49/02* (2006.01)
(Continued)

(52) U.S. Cl.
CPC ...... *H01L 27/3265* (2013.01); *H01L 21/0274* (2013.01); *H01L 21/02565* (2013.01);
(Continued)

(58) Field of Classification Search
CPC ............ H01L 27/3265; H01L 29/7869; H01L 27/3262
See application file for complete search history.

(56) References Cited

U.S. PATENT DOCUMENTS

2009/0141203 A1* 6/2009 Son .................. G02F 1/136213
349/39

FOREIGN PATENT DOCUMENTS

| CN | 103186002 | 7/2013 |
|---|---|---|
| CN | 203118952 | 8/2013 |

(Continued)

*Primary Examiner* — Quoc D Hoang
(74) *Attorney, Agent, or Firm* — Hemisphere Law, PLLC; Zhigang Ma (57) ABSTRACT

The present disclosure provides a transparent OLED display and a manufacturing method thereof. The manufacturing method of the transparent OLED display forms an active layer and a first storage capacitor electrode in the same process. The first storage capacitor electrode is made of the transparent metal oxide semiconductor material. A second storage capacitor electrode is manufactured by two photolithography processes so the second storage capacitor electrode is made of only a transparent conductive oxide material. A storage capacitor region where the first storage capacitor electrode and the second storage capacitor electrode are located is a transparent region. Thus, light transmittance and transparent display effect of the transparent (Continued)

OLED display is enhanced. Further, a terminal located in a peripheral region is formed and only made of the transparent conductive oxide material to prevent it from being corroded by water and oxygen. It enhances service life of the transparent OLED display.

7 Claims, 7 Drawing Sheets

(51) Int. Cl.

| | | |
|---|---|---|
| *H01L 29/66* | (2006.01) | |
| *H01L 51/00* | (2006.01) | |
| *H01L 21/02* | (2006.01) | |
| *H01L 29/24* | (2006.01) | |
| *H01L 21/027* | (2006.01) | |
| *H01L 29/786* | (2006.01) | |
| *H01L 51/56* | (2006.01) | |
| *H01L 27/12* | (2006.01) | |
| *H01L 51/52* | (2006.01) | |
| *H01L 29/423* | (2006.01) | |
| *H01L 29/49* | (2006.01) | |
| *H01L 21/441* | (2006.01) | |
| *H01L 29/45* | (2006.01) | |

(52) U.S. Cl.
CPC ...... *H01L 27/3246* (2013.01); *H01L 27/3248* (2013.01); *H01L 27/3262* (2013.01); *H01L 28/60* (2013.01); *H01L 29/24* (2013.01); *H01L 29/66969* (2013.01); *H01L 29/7869* (2013.01); *H01L 51/0021* (2013.01); *H01L 51/56* (2013.01); *H01L 21/0217* (2013.01); *H01L 21/02164* (2013.01); *H01L 21/441* (2013.01); *H01L 27/124* (2013.01); *H01L 27/127* (2013.01); *H01L 27/1225* (2013.01); *H01L 27/1255* (2013.01); *H01L 27/1262* (2013.01); *H01L 27/3276* (2013.01); *H01L 29/42364* (2013.01); *H01L 29/42372* (2013.01); *H01L 29/42384* (2013.01); *H01L 29/45* (2013.01); *H01L 29/4908* (2013.01); *H01L 51/5206* (2013.01); *H01L 51/5215* (2013.01); *H01L 2227/323* (2013.01); *H01L 2251/301* (2013.01); *H01L 2251/308* (2013.01); *H01L 2251/558* (2013.01)

(56) References Cited

FOREIGN PATENT DOCUMENTS

| | | |
|---|---|---|
| CN | 104681566 | 6/2015 |
| CN | 106990627 | 7/2017 |
| TW | 200726310 | 7/2007 |

\* cited by examiner

TRANSPARENT OLED DISPLAY WITH TRANSPARENT STORAGE CAPACITOR AND MANUFACTURING METHOD THEREOF

RELATED APPLICATIONS

The present application is a National Phase of International Application Number PCT/CN2017/113672, filed on Nov. 29, 2017, and claims the priority of China Application 201711003246.4, filed on Oct. 24, 2017.

FIELD OF THE DISCLOSURE

The disclosure relates to a display technical field, and more particularly to a transparent organic light-emitting diode (OLED) display and manufacturing method thereof.

BACKGROUND

An organic light-emitting diode (OLED) display, also known as an organic electroluminescent display, is an emerging flat panel display device. Because its advantages of simple preparation process, low cost, low power consumption, high light-emitting brightness, wide operating temperature adaptation, small size, and fast response. It is easy to realize color display and large-screen display, match an integrated circuit driver, and realize a flexible display. It has broad application prospects.

With the development of display technology, a transparent display device is proposed as a novel display device. The transparent display device can not only see the displayed image from the front of the screen, but also can see the object on the back of the transparent display through the screen. Transparent displays have a lot of possible applications such as buildings, windows of cars, and display windows for shopping malls. Besides the applications of these large devices, small devices such as hand-held tablets can benefit from the transparent displays. A lot of the existing display markets are expected to be replaced by the transparent displays. For example, they can be in the fields of construction, advertising, and public information.

Figure 1:
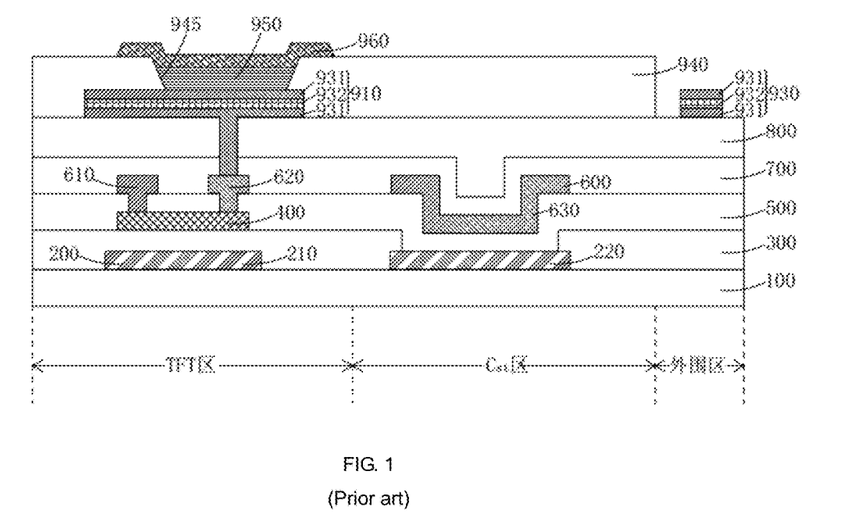
FIG. 1 is a cross-sectional view of a conventional transparent OLED display.
Figure 2:
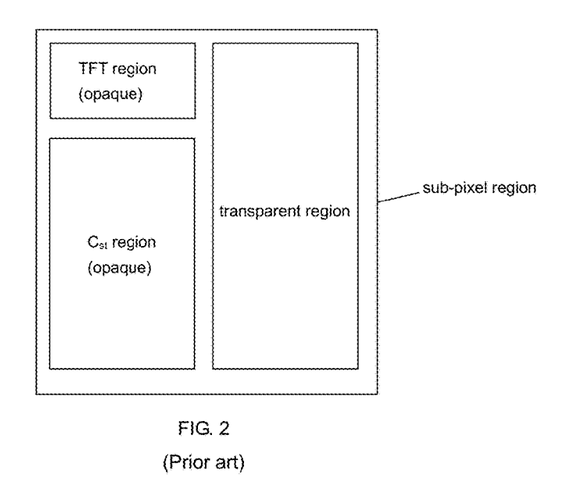
FIG. 2 is a plan structural view of a sub-pixel region of the transparent OLED display shown in FIG. 1.

FIG. 1 is a cross-sectional view of a conventional transparent OLED display. FIG. 2 is a plan structural view of a sub-pixel region of the transparent OLED display shown in FIG. 1. The transparent OLED display includes a display region and a peripheral region around the display region. The display region includes a plurality of sub-pixel regions. Referring to FIG. 2, each sub-pixel region includes an opaque thin film transistor (TFT) region, an opaque storage capacitor ($C_{st}$) region, and a transparent region other than the TFT region and the $C_{st}$ region. Referring to FIG. 1, the transparent OLED display includes a base substrate 100, a first metal layer 200 disposed on the base substrate 100, a gate insulating layer 300 disposed on the base substrate 100 and covering the first metal layer 200, an active layer 400 disposed on the gate insulating layer 300, an etching stop layer 500 disposed on the gate insulating layer 300 and covering the active layer 400, a second metal layer 600 disposed on the etching stop layer 500, a passivation layer 700 disposed on the etching stop layer 500 and covering the second metal layer 600, a flat layer 800 disposed on the passivation layer 700, an anode layer 910 disposed on the flat layer 800, a pixel defining layer 940 disposed on the flat layer 800 and the anode 910, an opening 945 disposed on the pixel defining layer 940 and corresponding to a top of the anode 910, an OLED light-emitting layer 950 disposed in the opening 945 and located on the anode 910, and a cathode 960 disposed on the OLED light-emitting layer 950 and the pixel definition layer 940.

The first metal layer 200 includes a gate 210 and a first storage capacitor electrode 220 disposed at intervals. The second metal layer 600 includes a source 610, a drain 620, and a second storage capacitor electrode 630 disposed at intervals.

The gate 210, the active layer 400, the source 610, the drain 620, the anode 910, the OLED light-emitting layer 950 and the cathode 960 are located in the TFT region. The first storage capacitor electrode 220 and the second storage capacitor electrode 630 are located in the $C_{st}$ region. Since the first storage capacitor electrode 220 and the second storage capacitor electrode 630 are both made of a metal material, the $C_{st}$ region is not light-transmitting. The $C_{st}$ region has a larger area and wastes a certain light-transmitting area and aperture ratio so it reduces the transparent display effect of the OLED display. In addition, during the preparation of the transparent OLED display, a terminal (pad) 930 located in the peripheral region are usually made of the same material as that of the anode 910 in the same process. Both the terminal 930 and the anode 910 are composite layers including two layers of indium tin oxide (ITO) film 931 sandwiching a layer of silver thin film 932. Since the terminal 930 is located in the peripheral area of the transparent OLED display and exposed to the external environment, it is easy to contact the water and oxygen. As a result, the silver thin film 932 is corroded to affect the electrical properties and service life of the terminal 930.

SUMMARY

The present disclosure provides a manufacturing method of a transparent organic light-emitting diode (OLED) display. It can enhance light transmittance of transparent OLED display, and electrical properties and service life of a terminal.

The present disclosure provides a transparent organic OLED display. It has higher light transmittance of transparent OLED display, and a terminal has better electrical properties and longer service life.

For achieving the objective above, the present disclosure provides a manufacturing method of a transparent OLED display including adopting a transparent metal oxide semiconductor material to manufacture a first storage capacitor electrode; and adopting a transparent conductive oxide material to manufacture a second storage capacitor electrode; wherein the second storage capacitor electrode and the first storage capacitor electrode together form a storage capacitor.

The manufacturing method of the transparent OLED display particularly includes the following steps.

Step S1: providing a base substrate, forming a gate on the base substrate, and forming a gate insulating layer on the base substrate and covering the gate.

Step S2: forming an active layer corresponding to a top of the gate and a first storage capacitor electrode on the gate insulating layer at intervals, wherein the active layer and the first storage capacitor electrode are both made of a transparent metal oxide semiconductor material.

Step S3: forming an etching stop layer covering the active layer and the first storage capacitor electrode on the gate insulating layer, wherein the etching stop layer includes a first through hole and a second through hole corresponding to two ends of the active layer.

Step S4: forming a source and a drain on the etching stop layer, wherein the source and the drain contact the two ends of the active layer via the first through hole and the second through hole.

Step S5: forming a passivation layer covering the source and the drain on the etching stop layer, wherein the passivation layer includes a third through hole corresponding to a top of the first storage capacitor electrode and a first via hole corresponding to a top of the drain, and forming a flat layer on the passivation layer, wherein the flat layer includes a second via hole corresponding to a top of the first via hole, the first via hole and the second via hole together form a fourth through hole, and the flat layer includes a fifth through hole formed in a region of the third through hole.

Step S6: depositing a first transparent conductive oxide layer and an anode metal layer on the flat layer from bottom to top, wherein the first transparent conductive oxide layer and the anode metal layer are patterned to form an anode preset pattern, and depositing a second transparent conductive oxide layer on the anode preset pattern, the flat layer, and the etching stop layer, wherein the second transparent conductive oxide layer is patterned to form an anode corresponding to the anode preset pattern on the flat layer and a second storage capacitor electrode located on the etching stop layer located on a bottom of the fifth through hole, the anode includes the first transparent conductive oxide layer, the anode metal layer, the second transparent conductive oxide layer sequentially laminated on the flat layer 80 from bottom to top, the second storage capacitor electrode includes the second transparent conductive oxide layer on the etching stop layer, the anode contacts the drain via the fourth through hole, and the second storage capacitor electrode and the first storage capacitor electrode together form a storage capacitor.

Step S7: forming a pixel defining layer on the anode, the second storage capacitor electrode, and the flat layer, wherein the pixel defining layer includes an opening corresponding to a top of the anode, forming an OLED light-emitting layer on the anode located inside the opening, and forming a cathode covering the OLED light-emitting layer on the OLED light-emitting layer and the pixel defining layer.

The base substrate includes a display region and a peripheral region located on a periphery of the display region, and in the step S6, after patterning the second transparent conductive oxide layer to form the anode and the second storage capacitor electrode, a terminal is formed on the flat layer and in the peripheral region and includes the second transparent conductive oxide layer disposed on the flat layer.

The first transparent conductive oxide layer and the second transparent conductive oxide layer are made of a transparent conductive oxide material, the transparent conductive oxide material includes indium tin oxide (ITO), a material of the anode metal layer includes Ag, thicknesses of the first transparent conductive oxide layer or the second transparent conductive oxide layer are both 500 Å-1000 Å, and a thickness of the anode metal layer is 1000 Å-3000 Å.

A method of manufacturing the active layer and the first storage capacitor electrode includes depositing the transparent metal oxide semiconductor material on the gate insulating layer; and patterning the transparent metal oxide semiconductor material to form the active layer and the first storage capacitor electrode by photolithography, wherein the transparent metal oxide semiconductor material comprises a material selected from a group consisting of indium gallium zinc oxide (IGZO), indium zinc tin oxide (IZTO), and indium gallium zinc tin oxide (IGZTO), and thicknesses of the active layer and the first storage capacitor electrode are both 100 Å-1000 Å.

The present disclosure further provides the transparent OLED display including a first storage capacitor electrode manufactured by a transparent metal oxide semiconductor material; and a second storage capacitor electrode manufactured by a transparent conductive oxide material; wherein the second storage capacitor electrode and the first storage capacitor electrode together form a storage capacitor.

The transparent OLED display particularly includes a base substrate; a gate disposed on the base substrate; a gate insulating layer on the base substrate and covering the gate; an active layer disposed on the gate insulating layer and corresponding to the top of the gate; a first storage capacitor electrode disposed on the gate insulating layer and with the active layer at intervals; an etching stop layer disposed on the gate insulating layer and covering the active layer and the first storage capacitor electrode; a source and a drain disposed on the etching stop layer; a passivation layer disposed on the etching stop layer and covering the source and the drain; a flat layer disposed on the passivation layer;

an anode disposed on the flat layer; a second storage capacitor electrode disposed on the etching stop layer and corresponding to a top of the first storage capacitor electrode; a pixel defining layer disposed on the anode; the second storage capacitor electrode, and the flat layer; an opening disposed on the pixel defining layer and corresponding to a top of the anode; an OLED light-emitting layer disposed in the opening and located on the anode; and a cathode disposed on the OLED light-emitting layer and the pixel defining layer and covering the OLED light-emitting layer.

The etching stop layer includes a first through hole and a second through hole corresponding to two ends of the active layer, the passivation layer includes a third through hole corresponding to a top of the first storage capacitor electrode, the flat layer and the passivation layer includes a fourth through hole corresponding to a top of the drain, and the flat layer includes a fifth through hole in the region of the third through hole.

The source and the drain respectively contact the two ends of the active layer via the first through hole and the second through hole, the anode contacts the drain via the fourth through hole, the second storage capacitor electrode is disposed on the etching stop layer located on the bottom of the fifth through hole, and the second storage capacitor electrode and the first storage capacitor electrode together form the storage capacitor.

The active layer and the first storage capacitor electrode are both made of the transparent metal oxide semiconductor material, the anode includes a first transparent conductive oxide layer, an anode metal layer, and a second transparent conductive oxide layer sequentially laminated on the flat layer from bottom to top, and the second storage capacitor electrode includes a second transparent conductive oxide layer disposed on the etching stop layer.

The base substrate includes a display region and a peripheral region located on a periphery of the display region, and the transparent OLED display further includes a terminal disposed on the flat layer and in the peripheral region and including the second transparent conductive oxide layer disposed on the flat layer.

The first transparent conductive oxide layer and the second transparent conductive oxide layer are made of a transparent conductive oxide material, the transparent conductive oxide material includes ITO, a material of the anode metal layer includes Ag, thicknesses of the first transparent conductive oxide layer or the second transparent conductive oxide layer are both 500 Å-1000 Å; and a thickness of the anode metal layer is 1000 Å-3000 Å.

The transparent metal oxide semiconductor material includes a material selected from a group consisting of IGZO, IZTO, and IGZTO, and thicknesses of the active layer and the first storage capacitor electrode are both 100 Å-1000 Å.

The present disclosure further provides a method of manufacturing a transparent OLED display including adopting a transparent metal oxide semiconductor material to manufacture a first storage capacitor electrode; and adopting a transparent conductive oxide material to manufacture a second storage capacitor electrode; wherein the second storage capacitor electrode and the first storage capacitor electrode together form a storage capacitor, further particularly including the following steps.

Step S1: providing a base substrate, forming a gate on the base substrate, and forming a gate insulating layer on the base substrate and covering the gate.

Step S2: forming an active layer corresponding to a top of the gate and a first storage capacitor electrode on the gate insulating layer at intervals, wherein the active layer and the first storage capacitor electrode are both made of a transparent metal oxide semiconductor material.

Step S3: forming an etching stop layer covering the active layer and the first storage capacitor electrode on the gate insulating layer, wherein the etching stop layer includes a first through hole and a second through hole corresponding to two ends of the active layer.

Step S4: forming a source and a drain on the etching stop layer; wherein the source and the drain contact the two ends of the active layer via the first through hole and the second through hole.

Step S5: forming a passivation layer covering the source and the drain on the etching stop layer, wherein the passivation layer includes a third through hole corresponding to a top of the first storage capacitor electrode and a first via hole corresponding to a top of the drain, and forming a flat layer on the passivation layer, wherein the flat layer includes a second via hole corresponding to a top of the first via hole, the first via hole and the second via hole together form a fourth through hole, and the flat layer includes a fifth through hole formed in a region of the third through hole.

Step S6: depositing a first transparent conductive oxide layer and an anode metal layer on the flat layer from bottom to top, wherein the first transparent conductive oxide layer and the anode metal layer are patterned to form an anode preset pattern, and depositing a second transparent conductive oxide layer on the anode preset pattern, the flat layer, and the etching stop layer, wherein the second transparent conductive oxide layer is patterned to form an anode corresponding to the anode preset pattern on the flat layer and a second storage capacitor electrode located on the etching stop layer located on a bottom of the fifth through hole, the anode includes the first transparent conductive oxide layer, the anode metal layer, the second transparent conductive oxide layer sequentially laminated on the flat layer from bottom to top, the second storage capacitor electrode includes the second transparent conductive oxide layer on the etching stop layer, the anode contacts the drain via the fourth through hole, and the second storage capacitor electrode and the first storage capacitor electrode together form a storage capacitor.

Step S7: forming a pixel defining layer on the anode, the second storage capacitor electrode, and the flat layer, wherein the pixel defining layer includes an opening corresponding to a top of the anode, forming an OLED light-emitting layer on the anode located inside the opening, and forming a cathode covering the OLED light-emitting layer on the OLED light-emitting layer and the pixel defining layer.

The base substrate includes a display region and a peripheral region located on a periphery of the display region, and in the step S6, after patterning the second transparent conductive oxide layer to form the anode and the second storage capacitor electrode, a terminal is formed on the flat layer and in the peripheral region and includes the second transparent conductive oxide layer disposed on the flat layer.

The first transparent conductive oxide layer and the second transparent conductive oxide layer are made of a transparent conductive oxide material, the transparent conductive oxide material includes ITO, a material of the anode metal layer includes Ag, thicknesses of the first transparent conductive oxide layer or the second transparent conductive oxide layer are both 500 Å-1000 Å, and a thickness of the anode metal layer is 1000 Å-3000 Å;

A method of manufacturing the active layer and the first storage capacitor electrode includes depositing the transparent metal oxide semiconductor material on the gate insulating layer; and patterning the transparent metal oxide semiconductor material to form the active layer and the first storage capacitor electrode by photolithography, wherein the transparent metal oxide semiconductor material includes a material selected from a group consisting of IGZO, IZTO, and IGZTO, and thicknesses of the active layer and the first storage capacitor electrode are both 100 Å-1000 Å.

The beneficial effect of the present disclosure is that the method of manufacturing the transparent OLED display forms the active layer and the first storage capacitor electrode in the same process. Thus, the first storage capacitor electrode is made of the transparent metal oxide semiconductor material. A second storage capacitor electrode is manufactured by two photolithography processes so the second storage capacitor electrode is made of only a transparent conductive oxide material. The storage capacitor region where the first storage capacitor electrode and the second storage capacitor electrode are located is a transparent region. It improves the light transmittance and the transparent display effect of transparent OLED display. Further, when forming the anode and the second storage capacitor electrode, a terminal located in the peripheral area is formed simultaneously. The terminal is only made of the transparent conductive oxide material to prevent it from being corroded by water and oxygen. It enhances electrical properties and service life of the terminal so it enhances the service life of transparent OLED display. The transparent OLED display of the present disclosure is manufactured by the method above so it has higher light transmittance, better transparent display effect, and longer service life.

For further understanding of the features and technical contents of the present disclosure, it should refer to the following detailed description and accompanying drawings of the present disclosure. However, the drawings are for reference only and are not intended to limit the present disclosure.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 3:
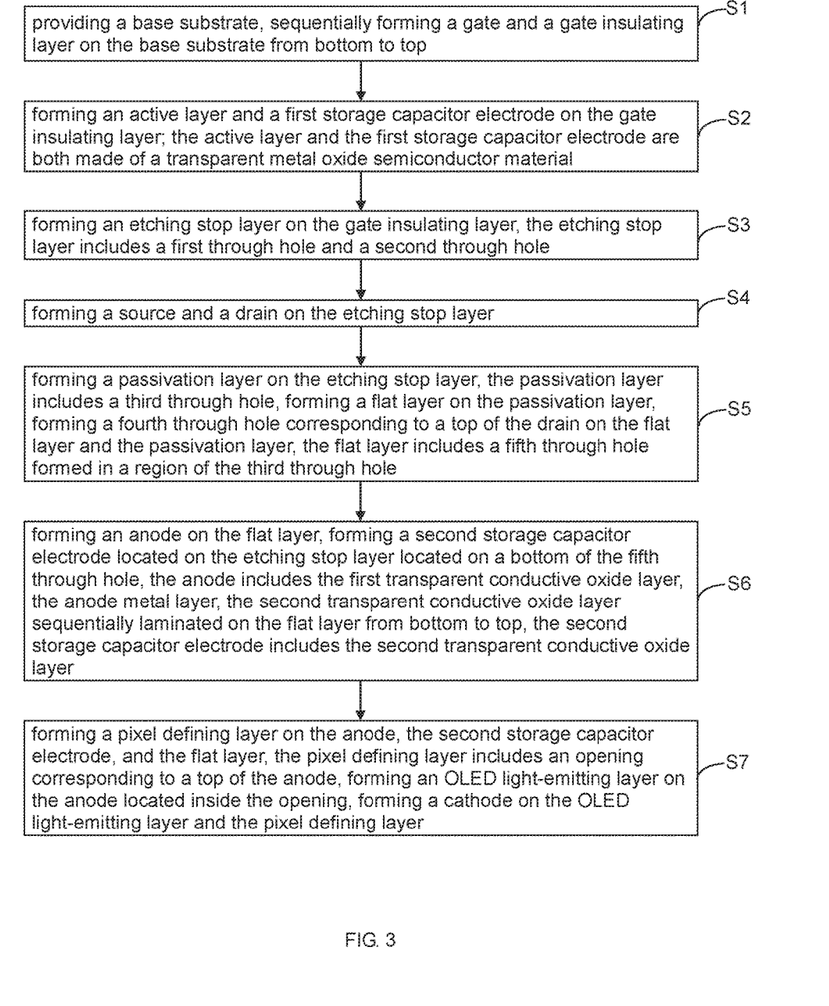
FIG. 3 is a flow chart of a manufacturing method of a transparent OLED display according to an embodiment of the present disclosure.

To further describe the technical means adopted by the present disclosure and the effects thereof, the disclosure will be described in detail with reference to accompanying drawings and preferred embodiments as follows Referring to FIG. 3, the present disclosure provides a manufacturing method of a transparent OLED display including following steps.

Figure 4:
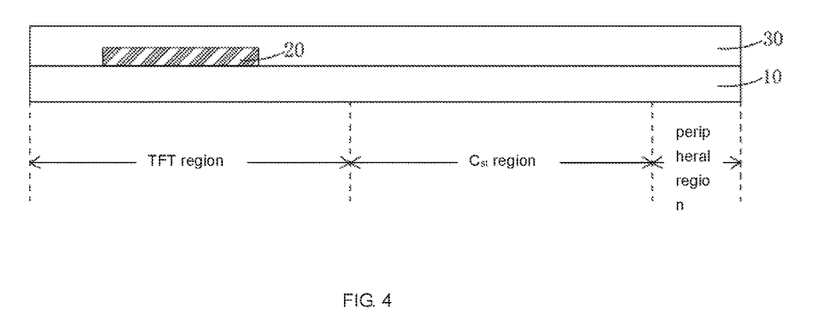
FIG. 4 is a schematic view of a step S1 of the manufacturing method of the transparent OLED display.

Step S1. Referring to FIG. 4, a base substrate 10 is provided and a gate 20 is formed on the base substrate 10. A gate insulating layer 30 is formed on the base substrate 10 and covers the gate 20.

Particularly, the base substrate 10 incised a display region and a peripheral region located on a periphery of the display region.

Particularly, a manufacturing method of the gate 20 includes depositing a gate metal material on the base substrate 10, and patterning the gate metal material to form the gate 20 by photolithography.

Particularly, the gate 20 includes a first gate metal layer and a second gate metal layer sequentially laminated on the base substrate 10 from bottom to top. A material of the first gate metal layer can be Mo, Ti, or alloy of Mo and Ti. A material of the second gate metal layer can be Cu.

Particularly, a thickness of the gate 20 is 2000 Å-8000 Å.

Particularly, the gate insulating layer 30 includes a SiOx layer, a SiNx layer, or a composite layer of the SiOx layer and the SiNx layer.

Particularly, a thickness of the gate insulating layer 30 is 1000 Å-3000 Å.

Figure 5:
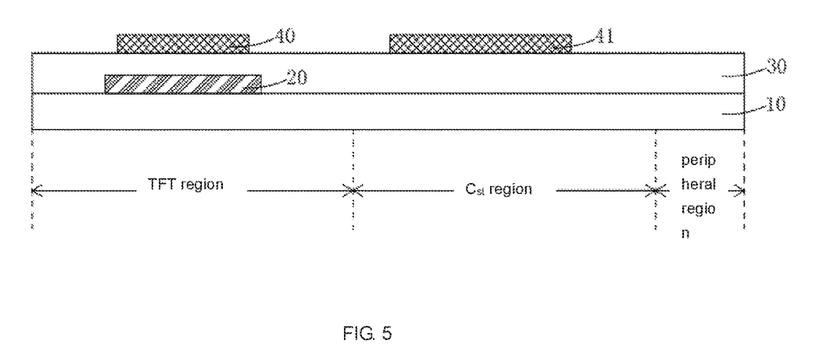
FIG. 5 is a schematic view of a step S2 of the manufacturing method of the transparent OLED display.

Step S2. Referring to FIG. 5, an active layer 40 corresponding to a top of the gate 20 and a first storage capacitor electrode 41 are formed on the gate insulating layer 30 at intervals. The active layer 40 and the first storage capacitor electrode 41 are both made of a transparent metal oxide semiconductor material.

Particularly, a manufacturing method of the active layer 40 and the first storage capacitor electrode 41 includes depositing the transparent metal oxide semiconductor material on the gate insulating layer 30, and patterning the transparent metal oxide semiconductor material to form the active layer 40 and the first storage capacitor electrode 41 by photolithography.

Particularly, the transparent metal oxide semiconductor material includes one or more of indium gallium zinc oxide (IGZO), indium zinc tin oxide (IZTO), and indium gallium zinc tin oxide (IGZTO).

Particularly, thicknesses of the active layer 40 and the first storage capacitor electrode 41 are both 100 Å-1000 Å.

Figure 6:
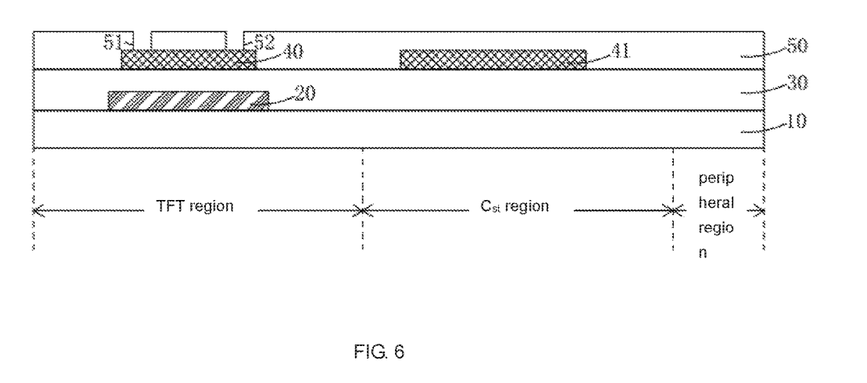
FIG. 6 is a schematic view of a step S3 of the manufacturing method of the transparent OLED display.

Step S3. Referring to FIG. 6, an etching stop layer 50 covering the active layer 40 and the first storage capacitor electrode 41 is formed on the gate insulating layer 30. The etching stop layer 50 includes a first through hole 51 and a second through hole 52 corresponding to the two ends of the active layer 40 respectively.

Particularly, the etching stop layer 50 includes the SiOx layer, the SiNx layer, or the composite layer of the SiOx layer and the SiNx layer.

Particularly, a thickness of the etching stop layer 50 is 500 Å-3000 Å.

Figure 7:
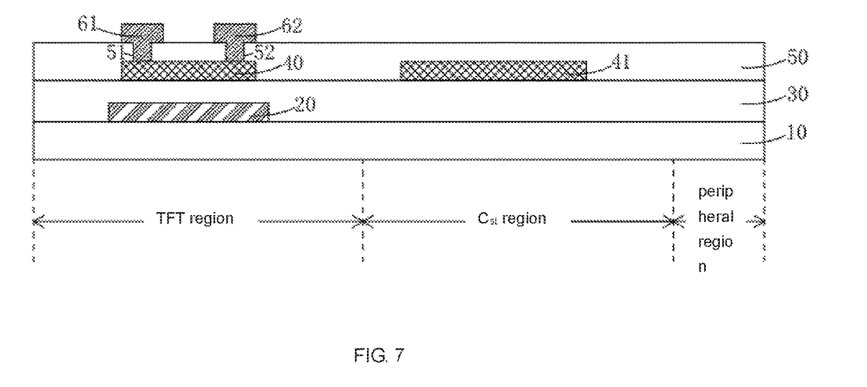
FIG. 7 is a schematic view of a step S4 of the manufacturing method of the transparent OLED display.

Step S4. Referring to FIG. 7, a source 61 and a drain 62 are formed on the etching stop layer 50. The source 61 and the drain 62 contact the two ends of the active layer 40 via the first through hole 51 and the second through hole 52 respectively.

Particularly, a manufacturing method of the source 61 and the drain 62 includes depositing a source metal material and a drain metal material on the etching stop layer 50, and patterning the source metal material and the drain metal material to form the source 61 and the drain 62 by photolithography.

Particularly, the source 61 includes a first source metal layer and a second source metal layer sequentially laminated on the etching stop layer 50 from bottom to top. The drain 62 includes a first drain metal layer and a second drain metal layer sequentially laminated on the etching stop layer 50 from bottom to top. A material of the first source metal layer or the first drain metal layer can be Mo, Ti, or alloy of Mo and Ti. A material of the second source metal layer or the second drain metal layer can be Cu.

Particularly, thicknesses of the source 61 and the drain 62 are both 2000 Å-8000 Å.

Figure 8:
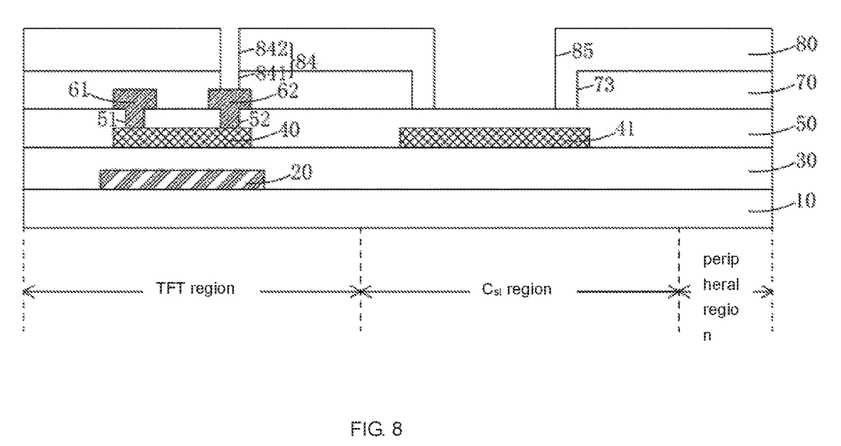
FIG. 8 is a schematic view of a step S5 of the manufacturing method of the transparent OLED display.

Step S5. Referring to FIG. 8, a passivation layer 70 covering the source 61 and the drain 62 is formed on the etching stop layer 50. The passivation layer 70 includes a third through hole 73 corresponding to a top of the first storage capacitor electrode 41 and a first via hole 841 corresponding to a top of the drain 62 respectively.

A flat layer 80 is formed on the passivation layer 70. The flat layer 80 includes a second via hole 842 corresponding to a top of the first via hole 841. The first via hole 841 and the second via hole 842 together form a fourth through hole 84.

The flat layer 80 includes a fifth through hole 85 formed in a region of the third through hole 73.

Particularly, the passivation layer 70 includes the SiOx layer, the SiNx layer, or the composite layer of the SiOx layer and the SiNx layer.

Particularly, a thickness of the passivation layer 70 is 1000 Å-5000 Å.

Particularly, a material of the flat layer 80 can be a photoresist material. The specific composition of the photoresist material is not limited.

Particularly, a thickness of the flat layer 80 is 10000 Å-20000 Å.

Figure 9:
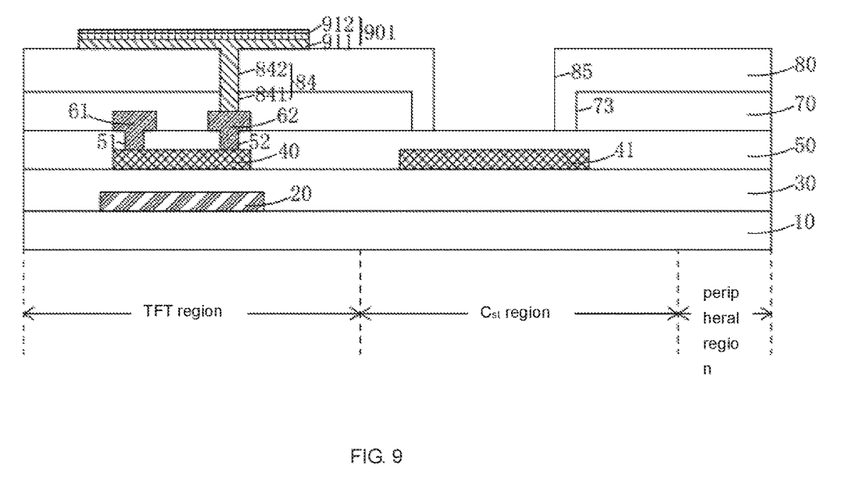
FIGS. 9 and 10 are schematic views of a step S6 of the manufacturing method of the transparent OLED display.
Figure 10:
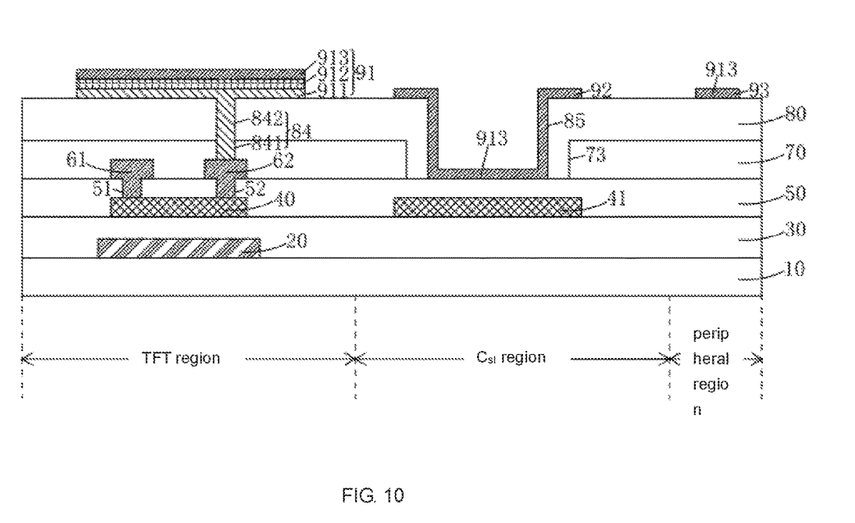

Step S6. Referring to FIGS. 9 and 10, a first transparent conductive oxide layer 911 and an anode metal layer 912 are sequentially deposited on the flat layer 80 from bottom to top. The first transparent conductive oxide layer 911 and the anode metal layer 912 are patterned to form an anode preset pattern 901.

A second transparent conductive oxide layer 913 is deposited on the anode preset pattern 901, the flat layer 80, and the etching stop layer 50. The second transparent conductive oxide layer 913 is patterned to form an anode 91 corresponding to the anode preset pattern 901 on the flat layer 80 and a second storage capacitor electrode 92 located on the etching stop layer 50 located on a bottom of the fifth through hole 85.

The anode 91 includes the first transparent conductive oxide layer 911, the anode metal layer 912, and the second transparent conductive oxide layer 913 sequentially laminated on the flat layer 80 from bottom to top. The second storage capacitor electrode 92 includes the second transparent conductive oxide layer 913 on the etching stop layer 50.

The anode 91 contacts the drain 62 via the fourth through hole 82. The second storage capacitor electrode 92 and the first storage capacitor electrode 41 together form a storage capacitor.

Preferably, in the step S6, after patterning the second transparent conductive oxide layer 913 to form the anode 91 and the second storage capacitor electrode 92, a terminal 93 is simultaneously formed on the flat layer 80 and in the peripheral region. The terminal 93 includes the second transparent conductive oxide layer 913 disposed on the flat layer 80.

The terminal 93 is connected to the driving IC and transmits the electric signal of the driving IC to a data line and a gate line. Because the terminal 93 is made of only the second transparent conductive oxide layer 913, the terminal 93 of the present disclosure does not have silver. Compared with the conventional terminal formed by two layers of indium tin oxide (ITO) sandwiching a silver film, the terminal 93 is not easy to be corroded by water and oxygen, and has better electrical properties and longer service life.

There is only the etching stop layer 50 between the second storage capacitor electrode 92 and the first storage capacitor electrode 41. That is, a thickness of an insulating layer between two electrode plates of the storage capacitor is smaller so it can obtain larger storage capacitor and improve display effect of the liquid crystal display (LCD).

Particularly, the first transparent conductive oxide layer 911 and the second transparent conductive oxide layer 913 are made of a transparent conductive oxide material. The transparent conductive oxide material includes ITO. A material of the anode metal layer 912 includes Ag.

Particularly, thicknesses of the first transparent conductive oxide layer 911 and the second transparent conductive oxide layer 913 are both 500 Å-1000 Å. A thickness of the anode metal layer 912 is 1000 Å-3000 Å.

Figure 11:
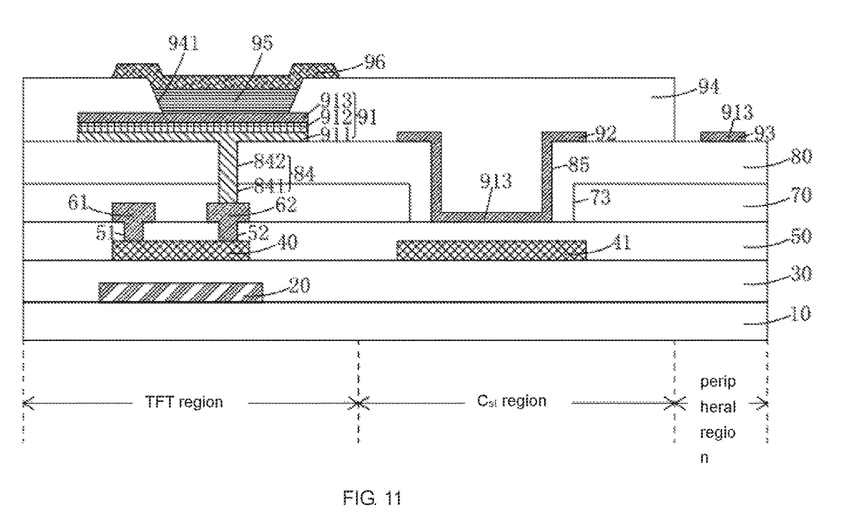
FIG. 11 is a schematic view of a step S7 of the manufacturing method and a cross-sectional view of the transparent OLED display according to an embodiment of the present disclosure.

Step S7. Referring to FIG. 11, a pixel defining layer 94 is formed on the anode 91, the second storage capacitor electrode 92, and the flat layer 80. The pixel defining layer 94 includes an opening 941 corresponding to a top of the anode 91.

An OLED light-emitting layer 95 is formed on the anode 91 located inside the opening 941. A cathode 96 covering the OLED light-emitting layer 95 is formed on the OLED light-emitting layer 95 and the pixel defining layer 94.

Particularly, a material of the pixel defining layer 94 can be the photoresist material. The specific composition of the photoresist material is not limited.

Particularly, a thickness of the pixel defining layer 94 is 10000 Å-20000 Å.

A manufacturing method of the OLED light-emitting layer 95 includes evaporation or Ink jet printing (IJP).

Particularly, the cathode 96 is a transparent electrode so an OLED device including the anode 91, the OLED light-emitting layer 95, and the cathode 96 can emit light from a top thereof.

Preferably, a material of the cathode 96 can be ITO.

Figure 12:
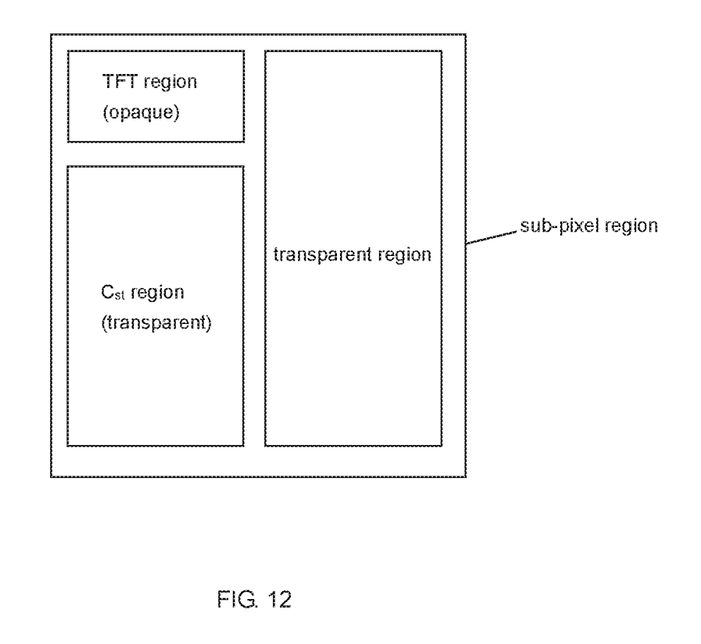
FIG. 12 is a plan structural view of a sub-pixel region of the transparent OLED display according to an embodiment of the disclosure.

Particularly, referring to FIG. 12, a transparent OLED display of the present disclosure includes the display region and the peripheral region located on a periphery of the display region. The terminal 93 is located in the peripheral region. The display region includes a plurality of sub-pixel regions. Each the sub-pixel region includes an opaque thin film transistor (TFT) region, an opaque storage capacitor ($C_{st}$) region, and a transparent region other than the TFT region and the $C_{st}$ region. The gate 20, the active layer 40, the source 61, the drain 62, the anode 91, the OLED light-emitting layer 95, and the cathode 96 are located in the TFT region. The first storage capacitor electrode 41 and the second storage capacitor electrode 92 are located in the storage capacitor region. Compared with the conventional art, the present disclosure sets the storage capacitor region as a transparent region so light transmittance of about 20% can be increased and the transparent display effect of the transparent OLED display can be improved.

The manufacturing method of the transparent OLED display of the present disclosure forms the active layer 40 and the first storage capacitor electrode 41 in the same process so the first storage capacitor electrode 41 is made of the transparent metal oxide semiconductor material. Two photolithography processes are adopted to manufacture the anode 91 and the second storage capacitor electrode 92 so the second storage capacitor electrode 92 is made of only the transparent conductive oxide material. Thus, the storage capacitor region where the first storage capacitor electrode 41 and the second storage capacitor electrode 92 are located is a transparent region. The light transmittance of the transparent OLED display is improved and the transparent display effect of the transparent OLED display is enhanced. Further, when the anode 91 and the second storage capacitor electrode 92 are formed, the terminal 93 located in the peripheral region is formed simultaneously. The terminal 93 is made of only the transparent conductive oxide material to prevent it from being corroded by water and oxygen. It enhances its electrical properties and service life so the service life of the transparent OLED display is enhanced.

Referring to FIGS. 11 and 12, based on the manufacturing method of the transparent OLED display above, the present disclosure further provides the transparent OLED display including the base substrate 10; the gate 20 disposed on the base substrate 10; the gate insulating layer 30 on the base substrate 10 and covering the gate 20; the active layer 40 disposed on the gate insulating layer 30 and corresponding to the top of the gate 20; the first storage capacitor electrode 41 disposed on the gate insulating layer 30 and with the active layer 40 at intervals; the etching stop layer 50 disposed on the gate insulating layer 30 and covering the active layer 40 and the first storage capacitor electrode 41; the source 61 and the drain 62 disposed on the etching stop layer 50; the passivation layer 70 disposed on the etching stop layer 50 and covering the source 61 and the drain 62; the flat layer 80 disposed on the passivation layer 70; the anode 91 disposed on the flat layer 80; the second storage capacitor electrode 92 disposed on the etching stop layer 50 and the flat layer 80, and corresponding to the top of the first storage capacitor electrode 41; the pixel defining layer 94 disposed on the anode 91, the second storage capacitor electrode 92, and the flat layer 80; the opening 941 disposed on the pixel defining layer 94 and corresponding to the top of the anode 91; the OLED light-emitting layer 95 disposed in the opening 941 and located on the anode 91; and the cathode 96 disposed on the OLED light-emitting layer 95 and the pixel defining layer 94 and covering the OLED light-emitting layer 95.

The etching stop layer 50 includes the first through hole 51 and the second through hole 52 corresponding to two ends of the active layer 40. The passivation layer 70 includes the third through hole 73 corresponding to the top of the first storage capacitor electrode 41. The flat layer 80 and the passivation layer 70 include the fourth through hole 84 corresponding to the top of the drain 62. The flat layer 80 includes the fifth through hole 85 in the region of the third through hole 73.

The source 61 and the drain 62 respectively contact the two ends of the active layer 40 via the first through hole 51 and the second through hole 52. The anode 91 contacts the drain 62 via the fourth through hole 84. The second storage capacitor electrode 92 is disposed on the etching stop layer 50 located on the bottom of the fifth through hole 85. The second storage capacitor electrode 92 and the first storage capacitor electrode 41 together form the storage capacitor.

The active layer 40 and the first storage capacitor electrode 41 are both made of the transparent metal oxide semiconductor material. The anode 91 includes the first transparent conductive oxide layer 911, the anode metal layer 912, and the second transparent conductive oxide layer 913 sequentially laminated on the flat layer 80 from bottom to top. The second storage capacitor electrode 92 includes the second transparent conductive oxide layer 913 disposed on the etching stop layer 50 and the flat layer 80.

Particularly, the base substrate 10 includes the display region and the peripheral region located on a periphery of the display region.

Particularly, the gate 20 includes the first gate metal layer and the second gate metal layer sequentially laminated on the base substrate 10 from bottom to top. The material of the first gate metal layer can be Mo, Ti, or alloy of Mo and Ti. The material of the second gate metal layer can be Cu.

Particularly, the thickness of the gate 20 is 2000 Å-8000 Å.

Particularly, the gate insulating layer 30 includes the SiOx layer, the SiNx layer, or the composite layer of the SiOx layer and the SiNx layer.

Particularly, the thickness of the gate insulating layer 30 is 1000 Å-3000 Å.

Particularly, the transparent metal oxide semiconductor material includes one or more of IGZO, IZTO, and IGZTO.

Particularly, the thicknesses of the active layer 40 and the first storage capacitor electrode 41 are both 100 Å-1000 Å.

Particularly, the etching stop layer 50 includes the SiOx layer, the SiNx layer, or the composite layer of the SiOx layer and the SiNx layer.

Particularly, the thickness of the etching stop layer 50 is 500 Å-3000 Å.

Particularly, the source 61 includes the first source metal layer and the second source metal layer sequentially laminated on the etching stop layer 50 from bottom to top. The drain 62 includes the first drain metal layer and the second drain metal layer sequentially laminated on the etching stop layer 50 from bottom to top. The material of the first source metal layer or the first drain metal layer can be Mo, Ti, or alloy of Mo and Ti. The material of the second source metal layer or the second drain metal layer can be Cu.

Particularly, the thicknesses of the source 61 and the drain 62 are both 2000 Å-8000 Å.

Particularly, the passivation layer 70 includes the SiOx layer, the SiNx layer, or the composite layer of the SiOx layer and the SiNx layer.

Particularly, the thickness of the passivation layer 70 is 1000 Å-5000 Å.

Particularly, the material of the flat layer 80 can be the photoresist material. The specific composition of the photoresist material is not limited.

Particularly, the thickness of the flat layer 80 is 10000 Å-20000 Å.

Particularly, the transparent OLED display further includes the terminal 93 disposed on the flat layer 80 and located in the peripheral region. The terminal 93 includes the second transparent conductive oxide layer 913 disposed on the flat layer 80.

Particularly, the first transparent conductive oxide layer 911 and the second transparent conductive oxide layer 913 are made of the transparent conductive oxide material. The transparent conductive oxide material includes ITO. The material of the anode metal layer 912 includes Ag.

Particularly, the thicknesses of the first transparent conductive oxide layer 911 and the second transparent conductive oxide layer 913 are both 500 Å-1000 Å. The thickness of the anode metal layer 912 is 1000 Å-3000 Å.

Particularly, the material of the pixel defining layer 94 can be the photoresist material. The specific composition of the photoresist material is not limited.

Particularly, the thickness of the pixel defining layer 94 is 10000 Å-20000 Å.

Particularly, the cathode 96 is the transparent electrode so the OLED device including the anode 91, the OLED light-emitting layer 95, and the cathode 96 can emit light from a top thereof.

Preferably, the material of the cathode 96 can be ITO.

The transparent OLED display of the present disclosure includes the first storage capacitor electrode 41 made of the transparent metal oxide semiconductor material and the second storage capacitor electrode 92 made of the transparent conductive oxide material. The storage capacitor region where the first storage capacitor electrode 41 and the second storage capacitor electrode 92 are located is the transparent region. Therefore, the transparent OLED display of the present disclosure has higher light transmittance and better transparent display effect. In addition, the terminal 93 located in the peripheral region of the transparent OLED display is made of the transparent conductive oxide material so it is not easy to be corroded by water and oxygen. It has better electrical properties and longer service life, and causes the transparent OLED display of the present disclosure to have longer service life.

In summary, the present disclosure provides the transparent OLED display and the manufacturing method thereof. The manufacturing method of the transparent OLED display of the present disclosure forms the active layer and the first storage capacitor electrode in the same process so the first storage capacitor electrode is made of the transparent metal oxide semiconductor material. The anode and the second storage capacitor electrode are manufactured by the two photolithography processes so the second storage capacitor electrode is made of only the transparent conductive oxide material. Thus, the storage capacitor region where the first storage capacitor electrode and the second storage capacitor electrode are located is the transparent region. The light transmittance of the transparent OLED display is improved and the transparent display effect of the transparent OLED display is enhanced. Further, when forming the anode and the second storage capacitor electrode, the terminal located in the peripheral region is formed simultaneously. The terminal is made of only the transparent conductive oxide material to prevent it from being corroded by water and oxygen. It enhances electrical properties and service life of the terminal so the service life of the transparent OLED display is enhanced. The transparent OLED display of the present disclosure is manufactured by the method above so it has higher light transmittance, better transparent display effect, and longer service life.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method of manufacturing a transparent organic light-emitting diode (OLED) display, comprising steps of:
   adopting a transparent metal oxide semiconductor material to manufacture a first storage capacitor electrode;
   adopting a transparent conductive oxide material to manufacture a second storage capacitor electrode; and
   forming a terminal comprising a second transparent conductive oxide layer in a peripheral region located on a periphery of a display region;
   wherein the second storage capacitor electrode and the first storage capacitor electrode together form a storage capacitor;
   the method further comprising steps of:
   step S1: providing a base substrate, forming a gate on the base substrate, and forming a gate insulating layer on the base substrate and covering the gate;
   step S2: forming an active layer corresponding to a top of the gate and the first storage capacitor electrode on the gate insulating layer at intervals, wherein the active layer and the first storage capacitor electrode are both made of a transparent metal oxide semiconductor material;
   step S3: forming an etching stop layer covering the active layer and the first storage capacitor electrode on the gate insulating layer, wherein the etching stop layer comprises a first through hole and a second through hole corresponding to two ends of the active layer;
   step S4: forming a source and a drain on the etching stop layer, wherein the source and the drain contact the two ends of the active layer via the first through hole and the second through hole;
   step S5: forming a passivation layer covering the source and the drain on the etching stop layer, wherein the passivation layer comprises a third through hole corresponding to a top of the first storage capacitor electrode and a first via hole corresponding to a top of the drain, and forming a flat layer on the passivation layer, wherein the flat layer comprises a second via hole corresponding to a top of the first via hole, the first via hole and the second via hole together form a fourth through hole, and the flat layer comprises a fifth through hole formed in a region of the third through hole;
   step S6: depositing a first transparent conductive oxide layer and an anode metal layer on the flat layer from bottom to top, wherein the first transparent conductive oxide layer and the anode metal layer are patterned to form an anode preset pattern, and depositing the second transparent conductive oxide layer on the anode preset pattern, the flat layer, and the etching stop layer, wherein the second transparent conductive oxide layer is patterned to form an anode corresponding to the anode preset pattern on the flat layer and the second storage capacitor electrode located on the etching stop layer located on a bottom of the fifth through hole, the anode comprises the first transparent conductive oxide layer, the anode metal layer, the second transparent conductive oxide layer sequentially laminated on the flat layer from bottom to top, the second storage capacitor electrode comprises the second transparent conductive oxide layer on the etching stop layer, the anode contacts the drain via the fourth through hole, and the second storage capacitor electrode and the first storage capacitor electrode together form a storage capacitor; and
   step S7: forming a pixel defining layer on the anode, the second storage capacitor electrode, and the flat layer, wherein the pixel defining layer comprises an opening corresponding to a top of the anode, forming an OLED light-emitting layer on the anode located inside the opening, and forming a cathode covering the OLED light-emitting layer on the OLED light-emitting layer and the pixel defining layer.

2. The method according to claim 1, wherein the first transparent conductive oxide layer and the second transparent conductive oxide layer are made of a transparent conductive oxide material, the transparent conductive oxide material comprises indium tin oxide (ITO), a material of the anode metal layer comprises Ag, thicknesses of the first transparent conductive oxide layer or the second transparent conductive oxide layer are both 500 Å-1000 Å, and a thickness of the anode metal layer is 1000 Å-3000 Å.

3. The method according to claim 1, wherein a method of manufacturing the active layer and the first storage capacitor electrode comprises steps of:
   depositing the transparent metal oxide semiconductor material on the gate insulating layer; and
   patterning the transparent metal oxide semiconductor material to form the active layer and the first storage capacitor electrode by photolithography,
   wherein the transparent metal oxide semiconductor material comprises a material selected from a group consisting of indium gallium zinc oxide (IGZO), indium zinc tin oxide (IZTO), and indium gallium zinc tin oxide (IGZTO), and thicknesses of the active layer and the first storage capacitor electrode are both 100 Å-1000 Å.

4. A transparent OLED display, comprising:
a first storage capacitor electrode manufactured by a transparent metal oxide semiconductor material;
a second storage capacitor electrode manufactured by a transparent conductive oxide material; and
a terminal comprising a second transparent conductive oxide layer formed in a peripheral region located on a periphery of a display region;
wherein the second storage capacitor electrode and the first storage capacitor electrode together form a storage capacitor;
the transparent OLED display further comprising:
a base substrate;
a gate disposed on the base substrate;
a gate insulating layer on the base substrate and covering the gate;
an active layer disposed on the gate insulating layer and corresponding to the top of the gate;
the first storage capacitor electrode disposed on the gate insulating layer and with the active layer at intervals;
an etching stop layer disposed on the gate insulating layer and covering the active layer and the first storage capacitor electrode;
a source and a drain disposed on the etching stop layer;
a passivation layer disposed on the etching stop layer and covering the source and the drain;
a flat layer disposed on the passivation layer;
an anode disposed on the flat layer;
the second storage capacitor electrode disposed on the etching stop layer and corresponding to a top of the first storage capacitor electrode;
a pixel defining layer disposed on the anode, the second storage capacitor electrode, and the flat layer;
an opening disposed on the pixel defining layer and corresponding to a top of the anode;
an OLED light-emitting layer disposed in the opening and located on the anode; and
a cathode disposed on the OLED light-emitting layer and the pixel defining layer and covering the OLED light-emitting layer;
wherein the etching stop layer comprises a first through hole and a second through hole corresponding to two ends of the active layer, the passivation layer comprises a third through hole corresponding to a top of the first storage capacitor electrode, the flat layer and the passivation layer comprise a fourth through hole corresponding to a top of the drain, and the flat layer comprises a fifth through hole in the region of the third through hole;
wherein the source and the drain respectively contact the two ends of the active layer via the first through hole and the second through hole, the anode contacts the drain via the fourth through hole, the second storage capacitor electrode is disposed on the etching stop layer located on the bottom of the fifth through hole, and the second storage capacitor electrode and the first storage capacitor electrode together form the storage capacitor;
wherein the active layer and the first storage capacitor electrode are both made of the transparent metal oxide semiconductor material, the anode comprises a first transparent conductive oxide layer, an anode metal layer, and the second transparent conductive oxide layer sequentially laminated on the flat layer from bottom to top, and the second storage capacitor electrode comprises a second transparent conductive oxide layer disposed on the etching stop layer.

5. The transparent OLED display according to claim 4, wherein the first transparent conductive oxide layer and the second transparent conductive oxide layer are made of a transparent conductive oxide material, the transparent conductive oxide material comprises ITO, a material of the anode metal layer comprises Ag, thicknesses of the first transparent conductive oxide layer or the second transparent conductive oxide layer are both 500 Å-1000 Å, and a thickness of the anode metal layer is 1000 Å-3000 Å.

6. The transparent OLED display according to claim 4, wherein the transparent metal oxide semiconductor material comprises a material selected from a group consisting of IGZO, IZTO, and IGZTO, and thicknesses of the active layer and the first storage capacitor electrode are both 100 Å-1000 Å.

7. A method of manufacturing a transparent OLED display, comprising steps of: adopting a transparent metal oxide semiconductor material to manufacture a first storage capacitor electrode; and adopting a transparent conductive oxide material to manufacture a second storage capacitor electrode; wherein the second storage capacitor electrode and the first storage capacitor electrode together form a storage capacitor, further comprising steps of:
step S1: providing a base substrate, forming a gate on the base substrate, and forming a gate insulating layer on the base substrate and covering the gate;
step S2: forming an active layer corresponding to a top of the gate and the first storage capacitor electrode on the gate insulating layer at intervals, wherein the active layer and the first storage capacitor electrode are both made of a transparent metal oxide semiconductor material;
step S3: forming an etching stop layer covering the active layer and the first storage capacitor electrode on the gate insulating layer, wherein the etching stop layer comprises a first through hole and a second through hole corresponding to two ends of the active layer;
step S4: forming a source and a drain on the etching stop layer, wherein the source and the drain contact the two ends of the active layer via the first through hole and the second through hole;
step S5: forming a passivation layer covering the source and the drain on the etching stop layer, wherein passivation layer comprises a third through hole corresponding to a top of the first storage capacitor electrode and a first via hole corresponding to a top of the drain, and forming a flat layer on the passivation layer, wherein the flat layer comprises a second via hole corresponding to a top of the first via hole, the first via hole and the second via hole together form a fourth through hole, and the flat layer comprises a fifth through hole formed in a region of the third through hole;
step S6: depositing a first transparent conductive oxide layer and an anode metal layer on the flat layer from bottom to top, wherein the first transparent conductive oxide layer and the anode metal layer are patterned to form an anode preset pattern, and depositing a second transparent conductive oxide layer on the anode preset pattern, the flat layer, and the etching stop layer, wherein the second transparent conductive oxide layer is patterned to form an anode corresponding to the anode preset pattern on the flat layer and the second storage capacitor electrode located on the etching stop layer located on a bottom of the fifth through hole, the anode comprises the first transparent conductive oxide layer, the anode metal layer, the second transparent conductive oxide layer sequentially laminated on the flat layer from bottom to top, the second storage capacitor electrode comprises the second transparent conductive oxide layer on the etching stop layer, the anode contacts the drain via the fourth through hole, and the second storage capacitor electrode and the first storage capacitor electrode together form a storage capacitor;

step S7: forming a pixel defining layer on the anode, the second storage capacitor electrode, and the flat layer, wherein the pixel defining layer comprises an opening corresponding to a top of the anode, forming an OLED light-emitting layer on the anode located inside the opening, and forming a cathode covering the OLED light-emitting layer on the OLED light-emitting layer and the pixel defining layer;

wherein the base substrate comprises a display region and a peripheral region located on a periphery of the display region, and in the step S6, after patterning the second transparent conductive oxide layer to form the anode and the second storage capacitor electrode, a terminal is formed on the flat layer and in the peripheral region and comprises the second transparent conductive oxide layer disposed on the flat layer;

wherein the first transparent conductive oxide layer and the second transparent conductive oxide layer are made of a transparent conductive oxide material, the transparent conductive oxide material comprises ITO, a material of the anode metal layer comprises Ag, thicknesses of the first transparent conductive oxide layer or the second transparent conductive oxide layer are both 500 Å-1000 Å, and a thickness of the anode metal layer is 1000 Å-3000 Å;

wherein a method of manufacturing the active layer and the first storage capacitor electrode comprises steps of:

depositing the transparent metal oxide semiconductor material on the gate insulating layer; and patterning the transparent metal oxide semiconductor material to form the active layer and the first storage capacitor electrode by photolithography, wherein the transparent metal oxide semiconductor material comprises a material selected from a group consisting of IGZO, IZTO, and IGZTO, and thicknesses of the active layer and the first storage capacitor electrode are both 100 Å-1000 Å.

* * * * *